United States Patent
Siddiqui et al.

(10) Patent No.: US 9,842,642 B2
(45) Date of Patent: Dec. 12, 2017

(54) TWO PHASE WRITE SCHEME TO IMPROVE LOW VOLTAGE WRITE ABILITY IN DEDICATED READ AND WRITE PORT SRAM MEMORIES

(71) Applicant: Synopsys, Inc., Mountain View, CA (US)

(72) Inventors: M. Sultan M. Siddiqui, Uttar Pradesh (IN); Shailendra Sharad, Uttar Pradesh (IN); Hemant Vats, New Delhi (IN); Amit Khanuja, New Delhi (IN)

(73) Assignee: Synopsys, Inc., Mountain View, CA (US)

( * ) Notice: Subject to any disclaimer, the term of this patent is extended or adjusted under 35 U.S.C. 154(b) by 31 days.

(21) Appl. No.: 14/828,364

(22) Filed: Aug. 17, 2015

(65) Prior Publication Data

US 2016/0049191 A1 Feb. 18, 2016

(30) Foreign Application Priority Data

Aug. 18, 2014 (EP) ..................... 14181308

(51) Int. Cl.
*G11C 7/22* (2006.01)
*G11C 11/419* (2006.01)
(Continued)

(52) U.S. Cl.
CPC ............ *G11C 11/419* (2013.01); *G11C 7/227* (2013.01); *G11C 8/08* (2013.01); *G11C 11/418* (2013.01); *G11C 2207/229* (2013.01)

(58) Field of Classification Search
CPC ..... G11C 11/412; G11C 11/419; G11C 11/41; G11C 11/418
See application file for complete search history.

(56) References Cited

U.S. PATENT DOCUMENTS

| 7,755,926 B2* | 7/2010 | Tan ......................... G11C 5/025 365/154 |
| 2007/0030741 A1* | 2/2007 | Nii ............................ G11C 5/06 365/189.11 |

(Continued)

OTHER PUBLICATIONS

Takeda, K. et al., "Multi-Step Word-Line Control Technology in Hierarchical Cell Architecture for Scaled-Down High-Density SRAMs," IEEE Journal of Solid-State Circuits, Apr. 2011, pp. 806-814, vol. 46, No. 4.

(Continued)

*Primary Examiner* — Huan Hoang
*Assistant Examiner* — Roberto Mancera, Jr.
(74) *Attorney, Agent, or Firm* — Fenwick & West LLP

(57) ABSTRACT

An integrated circuit for storing data comprises a memory cell array comprising a plurality of bit cells (BC1, . . . , BCn) comprising a first and a second one of the bit cells (BC1, BC2) having a static random access memory architecture. The first and the second bit cells (BC1, BC2) are coupled to a common wordline (WL_TOP) and are arranged in different columns (C1, C2) of the memory cell array (100). During a write access to the first bit cell (BC1), the first bit cell (BC1) undergoes a write operation, whereas the second bit cell (BC2) is a half-selected bit cell which undergoes a pseudo read operation. The integrated circuit uses a two-phase write scheme to improve the write-ability in low operating voltage environment.

12 Claims, 6 Drawing Sheets

(51) Int. Cl.
 *G11C 11/418* (2006.01)
 *G11C 8/08* (2006.01)

(56) References Cited

U.S. PATENT DOCUMENTS

| | | | | |
|---|---|---|---|---|
| 2008/0106963 | A1* | 5/2008 | Wang | G11C 11/418 365/207 |
| 2009/0273994 | A1* | 11/2009 | Chang | G11C 7/22 365/194 |
| 2011/0235406 | A1* | 9/2011 | Jung | G11C 11/412 365/156 |
| 2012/0327727 | A1* | 12/2012 | Wang | G11C 11/417 365/189.16 |
| 2013/0155793 | A1* | 6/2013 | Schreiber | G11C 11/418 365/194 |
| 2014/0119101 | A1* | 5/2014 | Wang | G11C 8/08 365/154 |
| 2014/0211578 | A1* | 7/2014 | Chen | G11C 8/16 365/194 |
| 2015/0162056 | A1* | 6/2015 | Gupta | G11C 16/08 365/203 |

OTHER PUBLICATIONS

European Extended Search Report, European Application No. 14181308.9, dated Feb. 3, 2015, 8 pages.

* cited by examiner

TWO PHASE WRITE SCHEME TO IMPROVE LOW VOLTAGE WRITE ABILITY IN DEDICATED READ AND WRITE PORT SRAM MEMORIES

CROSS REFERENCE TO RELATED APPLICATIONS

This application claims the right of priority based on European application serial no. 14181308.9, filed Aug. 18, 2014, which is incorporated by reference in its entirety.

BACKGROUND

Conventionally to improve the static noise margin of an SRAM bit cell, a wordline underdrive scheme through a read assist circuit is employed to meet cells hold stability. However, this scheme degrades the write margin of the cells resulting in write failures when operated in low voltage (VDDMIN) environment. State-of-the-art SRAM try to improve the write margin either through a negative bitline or wordline overdrive write assist circuits in the low voltage VDDMIN environment. Essentially, write assist circuits employ voltage boosting which overdrives the pass gate of a bit cell to improve the write margin. But at higher voltage operations, voltage boosting through a write assist circuit would cross the maximum allowable technology voltage and will have a detrimental effect on bit cells pass gate oxide tox reliability like hot carrier injection and time-dependent dielectric breakdown.

It is desirable to provide an integrated circuit for storing data which allows to improve the write margin in a low operating voltage environment.

SUMMARY

The disclosure relates to an integrated circuit for storing data which may be operated with low operating voltages. The disclosure further relates to a memory device being operated in a low operating voltage environment and a method to operate an integrated circuit for storing data.

Scaling of technology enables integration of more functions on a single die, thereby increasing dynamic power and leakage. Today's battery-operating portable devices demand low power for system-on-a-chip (SOC). Dynamic voltage and frequency scaling is the most effective way to reduce power in SOC designs through lower operating voltage and low frequency of operation. An integrated circuit for storing data comprising a memory cell array with bit cells having a static random access memory (SRAM) architecture is a vital part of most SOC designs.

Lower operating voltages (VDDMIN) reduce the overdrive voltage in a memory cell array. Shrinkage of technology increases the variability of an integrated circuit for storing data impacting static noise margin (SNM) and write margin (WM) in an integrated circuit comprising a memory cell array with bit cells of the SRAM type translating to low functional yield. With FINFET technology, the static noise margin and the write margin of a bit cell further worsen due to width limitation constraint for SRAM bit cell designs.

An embodiment of an integrated circuit for storing data comprises a memory cell array comprising a plurality of bit cells comprising a first and a second one of the bit cells having a static random access memory architecture and a plurality of wordlines and bitlines being arranged in rows and columns in the memory cell array and being operatively connected to the plurality of bit cells such that the first and the second bit cell are coupled to one of the wordlines and the first bit cell is coupled to a first one of the bitlines and the second bit cell is coupled to a second one of the bitlines, wherein the first and the second bitline are arranged in different columns of the memory cell array. The integrated circuit further comprises a column address decoder to select one of the first and second bitline for transferring a data value to be written in one of the first and second bit cell coupled to the selected one of the first and second bitline and said one of the wordlines. The integrated circuit comprises a write driver to provide the data value to the selected one of the first and second bitline to write the data value in said one of the first and second bit cell during a write access to said one of the first and the second bit cell. The write driver is coupled to the first and the second bitline.

The integrated circuit is configured to be operated in a write operation mode to generate a wordline voltage on said one of the wordline to write the data value in the first bit cell. The column address decoder is configured to select the first bitline for the write access to the first bit cell in the write operation mode. The write driver is configured to provide the data value to the first bitline in the write operation mode. The integrated circuit is configured to generate the wordline voltage with a voltage level in dependence on a course of the voltage level of the second bitline during a write access to the first bit cell in the write operation mode.

The integrated circuit may be configured to be operated in a first phase and in a subsequent second phase of the write operation mode. The integrated circuit is configured to be operated in the first phase of the write operation mode such that the wordline voltage is increased at the beginning of the first phase of the write operation mode from a first voltage level, for example 0 V, to a second voltage level, for example a voltage level of 0.85×VDD, which is kept constant until to the end of the first phase of the write operation mode, when VDD is the voltage level of the supply voltage. The integrated circuit is further configured to be operated in the second phase of the write operation mode such that the wordline voltage is increased at the beginning of the second phase of the write operation mode from the second voltage level, for example 85% of the supply voltage VDD (0.85× VDD) to a third voltage level, for example, the supply voltage level VDD, which is kept constant until to the end of the second phase of the write operation mode.

The described two-phase write scheme of the integrated circuit allows to improve the write margin in a low operating voltage environment using voltages which may be 30% less than the nominal supply voltage level VDD of the integrated circuit. The supply voltage may be provided at a power rail of the integrated circuit. Throughout the write operation for a selected bit cell, a healthy static noise margin is maintained for half-selected bit cells in a column multiplexed static random access memory (SRAM) architecture. At higher voltages, such as voltages which are about 20 to 30% above the nominal supply voltage, the two-phase write scheme does not risk the bit cell pass gate oxide tox reliability by not employing voltage boosting to improve the write margin in a low operating voltage environment.

According to an embodiment of the integrated circuit, the improved write margin in the low operating voltage environment may be achieved by means of the two-phase write scheme by using an adequately medium-sized pass gate and pull-down devices in SRAM bit cells of the memory cell array to cope with variability dependent write margin degradation at a low operating voltage (VDDMIN) environment and by driving the wordline voltage level to a power supply rail. The scheme is well-suited for medium-density SRAM memories such as register files.

The integrated circuit for storing data may be included in a memory device.

The integrated circuit for storing data may be operated in an example method (or process) embodiment as further described herein. The process comprises providing a memory cell array. The memory cell array comprises a plurality of bit cells. The plurality of bit cells comprises a first and a second one of the bit cells having a static-random-access memory architecture. A plurality of wordlines and bitlines are arranged in rows and columns in the memory cell array and are operatively connected to the plurality of bit cells such that the first and the second bit cell are coupled to one of the wordlines and the first bit cell is coupled to a first one of the bitlines and the second bit cell is coupled to a second one of the bitlines. The first and the second bitline are arranged in different columns of the memory cell array. A column address decoder is to select one of the first and second bitline for transferring a data value to be written in one of the first and second bit cell coupled to the selected one of the first and second bitline and said one of the wordlines. A write driver is to provide the data value to the selected one of the first and second bitline to write the data value in said one of the first and second bit cell during a write access to said one of the first and the second bit cell. The write driver is coupled to the first and the second bitline.

The process also comprises operating the integrated circuit in a write operation mode to generate a wordline voltage on said one of the wordline to write the data value in the first bit cell, selecting the first bitline for the write access to the first bit cell in the write operation mode, providing the data value to the first bitline in the write operation mode, and generating the wordline voltage with a voltage level in dependence on a course of the voltage level of the second bitline during a write access to the first bit cell in the write operation mode.

A circuit description representing the integrated circuit for storing data and/or the memory device comprising the integrated circuit for carrying out the method to operate the integrated circuit may be stored on a readable storage medium and be used in a design tool, in particular in an electronic design automation tool.

DETAILED DESCRIPTION

Figure 1:
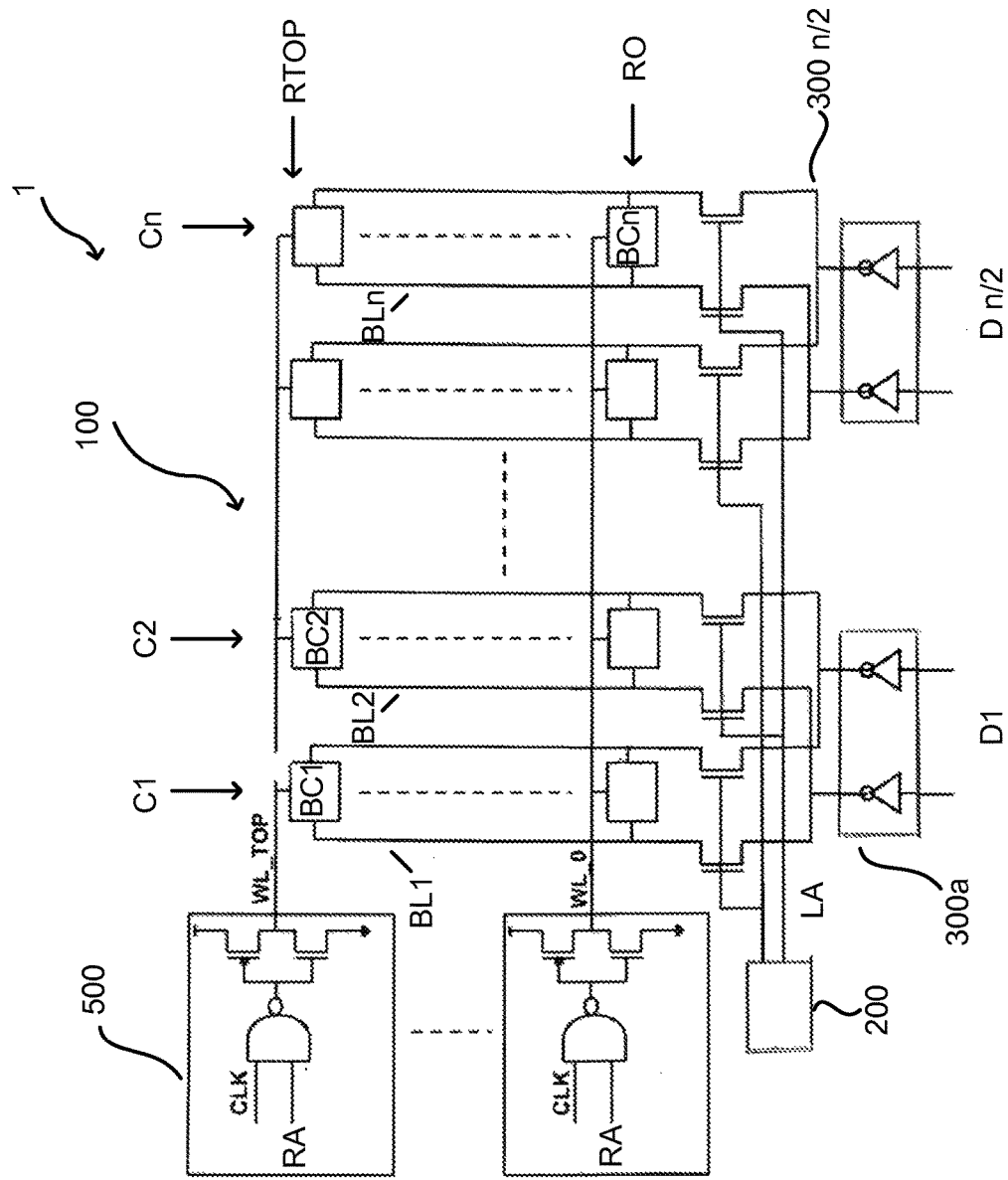
FIG. 1 shows an embodiment of an integrated circuit comprising a column multiplexed SRAM architecture.

FIG. 1 shows an integrated circuit 1 for storing data comprising a memory cell array 100 in a column multiplexed SRAM architecture. The memory cell array 100 comprises bit cells BC1, BC2, . . . , BCn which are arranged in columns C1, C2, . . . , Cn and rows R0, . . . , RTOP. The bit cells may be configured as SRAM cells which are operatively connected to a corresponding wordline WL_0, . . . , WL_TOP and complementary-pair bitlines from which only one of the bitlines BL1, BL2, . . . , BLn is shown in FIG. 1 for reasons of simplified illustration. Every bit cell arranged in a common row is connected to a common wordline.

One of the bit cells may be selected for a read or write access by means of a column address signal CA generated by a column address decoder 200 and a row address signal RA generated by a row address decoder, not shown in FIG. 1. In order to select one of the bit cells in one of the rows R0, . . . , RTOP and columns C1, . . . , Cn a respective wordline driver circuit 500 connected to said one of the wordlines is activated by means of a corresponding row address signal RA to drive the selected wordline with a voltage level, for example a high voltage level, of a wordline voltage. In order to select one of the columns, the column address decoder 200 generates an appropriate column address signal CA to address one of the columns. The selected bit cell is the bit cell which is located at the crossing of the selected row and the selected column.

Write drivers 300a, . . . , 300n/2 are provided to write data values D1, . . . , Dn/2 to the bit cells. The memory cell array 100 having the column multiplexed SRAM architecture allows sharing a common write driver for a set of columns. As shown in FIG. 1, the write driver 300a is configured to drive bitline BL1 arranged in column C1 and bitline BL2 arranged in column C2.

During a write cycle in a memory cell array of a column multiplexed SRAM architecture, a selected column bit cell called hereinafter "selected cell", for example bit cell BC1, undergoes a write operation. An unselected column bit cell called hereinafter "half-selected cell", for example bit cell BC2, which is connected to the same wordline undergoes a pseudo read operation resulting in a bitline voltage discharging of the bitline BL2 through the half-selected bit cell. This is because both the selected and the half-selected cells share the same row address and a common wordline signal.

Therefore, the worst case read static noise margin of a half-selected bit cell is tested raising concern over cell's hold stability during a write cycle. To improve the read static noise margin, a wordline underdrive scheme through a read assist circuit may be used to meet the cell's hold stability. However, this scheme degrades the cell's write margin resulting in write failures when operated in low operating voltage environment. SRAM designs usually improves a write margin either through negative bitline or overdrive write assist circuits at the cost of bit cell's pass gate oxide tox reliability at higher voltage operations.

Figure 2:
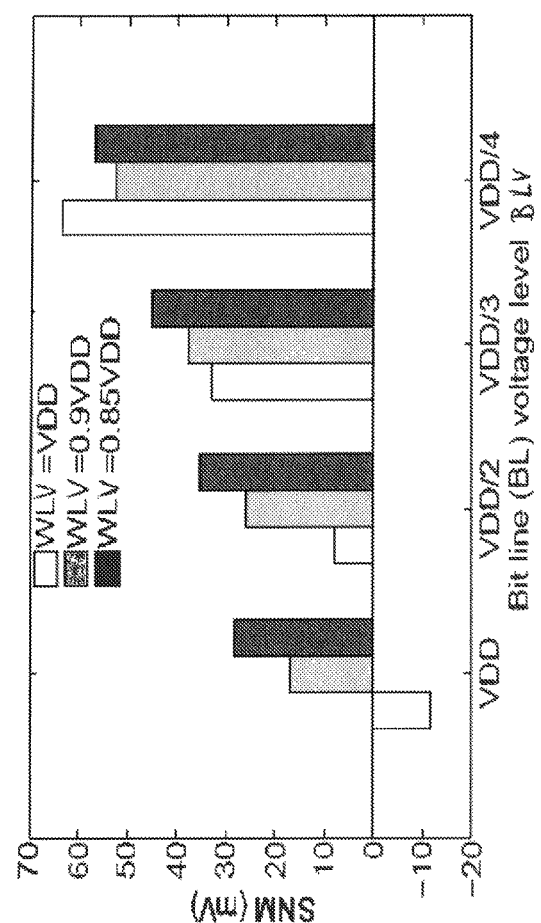
FIG. 2 shows simulation results for a worst 5σ bit cell static noise margin.

FIG. 2 depicts 5σ worst static noise margin characteristics of a half-selected bit cell, for example bit cell BC2, during a write access to the selected cell, for example bit cell BC1, as a function of both wordline voltage levels WLV and bitline voltage levels BLV. The static noise margin is defined as the maximum DC noise voltage that a SRAM bit cell can tolerate without flipping its stored data value. The static noise margin of a SRAM bit cell depends on both wordline voltage WLV and bitline voltage levels BLV. As shown in FIG. 2, the static noise margin of a bit cell improves with decrease in the wordline voltage level WLV and fixed bitline voltage level BLV. Furthermore, FIG. 2 also depicts an improvement of the static noise margin of a bit cell with decrease in bitline voltage level BLV and fixed wordline voltage level WLV.

Figure 3:
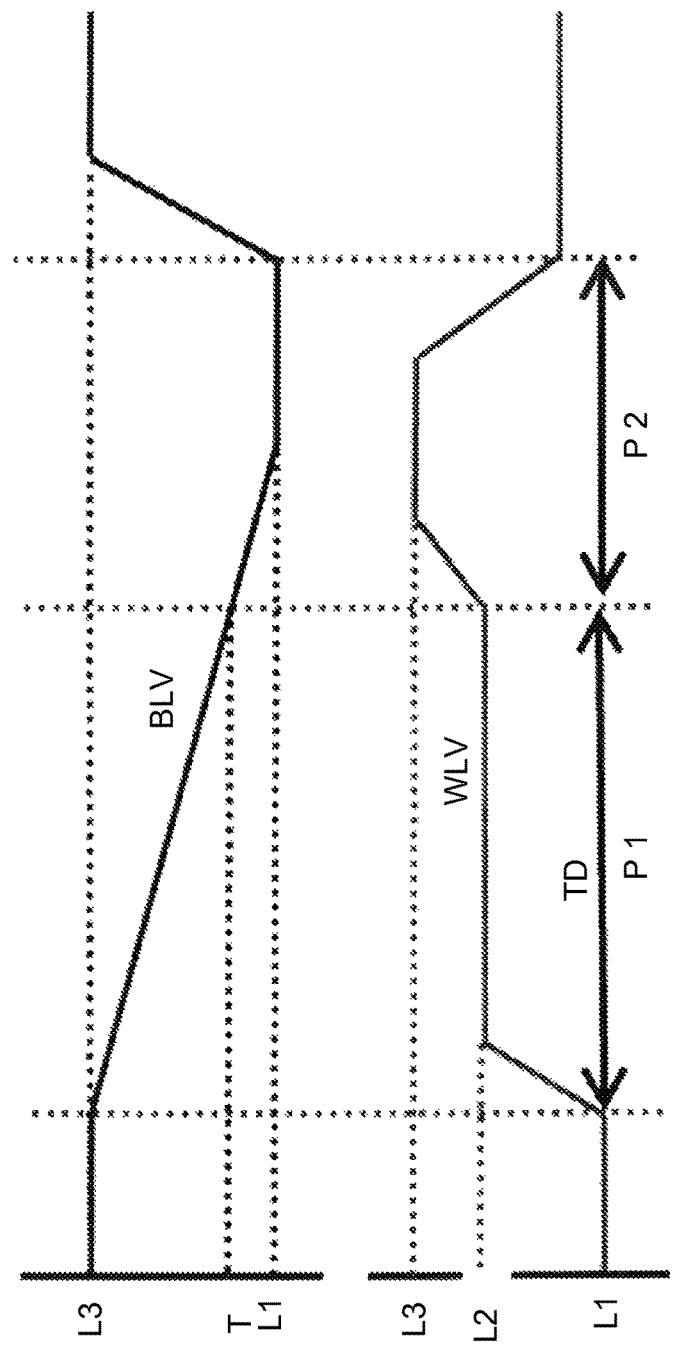
FIG. 3 illustrates voltage levels of a wordline and a bitline of an integrated circuit using a two-phase write scheme to improve the bit cell write margin.

FIG. 3 shows voltage levels of a wordline and a bitline of an integrated circuit using a two-phase write scheme to improve the write margin in a write access to a bit cell in a low operating voltage environment VDDMIN. VDDMIN is the minimum voltage level at which the SRAM bit cell is fully functional without any failures. The two-phase write scheme exploits the fact that the static noise margin is improved as the bitline voltage is lowered. In a first phase P1 of the write scheme, the selected wordline is driven by an underdrive wordline voltage level L2 to have healthy cell's hold stability. The underdrive wordline voltage level L2 may be in a range of between 0.8×VDD and 0.9×VDD, wherein VDD is the supply voltage level of the integrated circuit. At the beginning of the first phase P1, when the bitlines voltage level BLV is L3 which is equal to the supply voltage level VDD and the wordline voltage level WLV is 0.85×VDD, the static noise margin is about 28 mV as shown in FIG. 2.

As time elapses the bitline voltage level BLV falls trying to get synchronized with the data stored in the half-selected bit cells experiencing pseudo read. The first phase P1 lasts for a time duration TD allowing bitline voltage level BLV to fall to a threshold level T, for example a level of T≤VDD/3. When the bitline voltage level BLV reaches the threshold value T, for example the voltage level of VDD×0.3, the static noise margin is improved as depicted in FIG. 2 (SNM=34 mV when WLV=VDD; SNM=46 mV when WLV=0.85× VDD). Now with this improved static noise margin (static noise margin=34 mV when WLV=VDD), the two-phase write scheme enters a second phase P2 allowing the wordline voltage level WLV to rise to the full voltage level VDD of the supply voltage.

Figure 4:
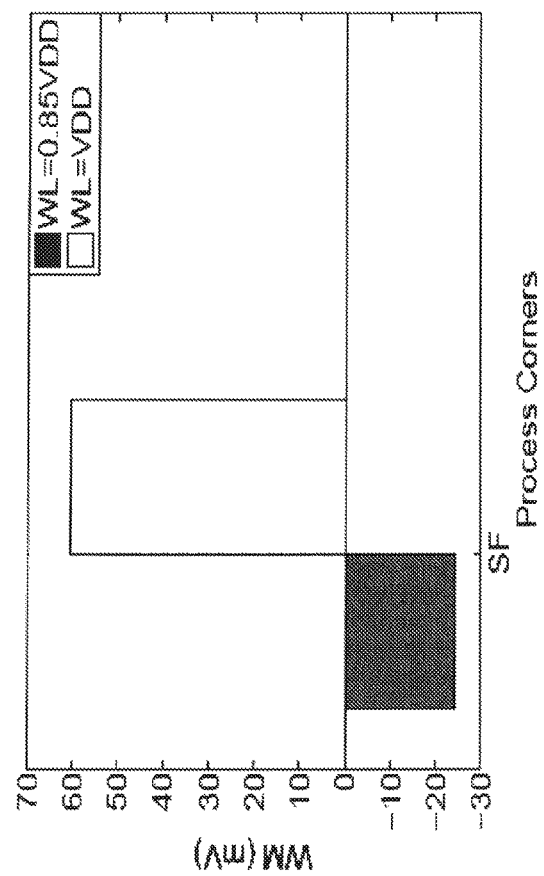
FIG. 4 shows simulation results for a worst 5σ bit cell write margin.

The write margin is defined as the maximum bitline voltage needed to flip the contents of a bit cell. The lower value of the write margin indicates the degree of hardness to write into the bit cell. FIG. 4 depicts 5σ worst write margin as a function of the wordline voltage levels WLV operating at 0.52 V in worst process corner SF (slow NMOS fast PMOS). As clearly visible from the simulations in FIG. 4, the 5σ worst write margin improves by 85 mV as the wordline voltage WLV is increased from 0.85×VDD to VDD. Thus, in phase P2 of the two-phase write scheme, the write margin is improved by allowing the wordline voltage level WLV to rise to the full voltage level VDD of the supply voltage.

Figure 5:
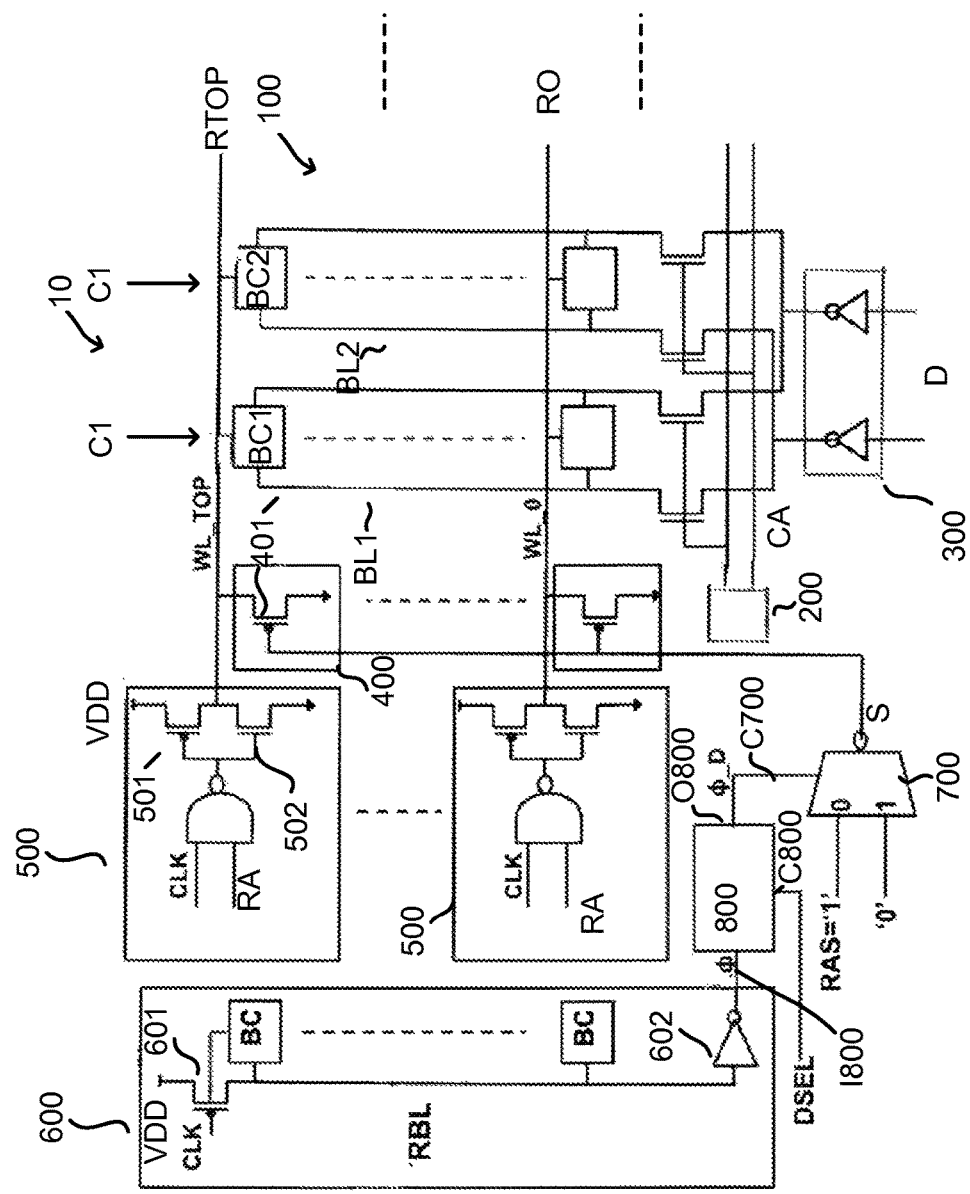
FIG. 5 shows an embodiment of an integrated circuit for storing data with a two-phase write scheme architecture.

FIG. 5 shows an integrated circuit 10 to implement the two-phase write scheme. The integrated circuit 10 comprises the memory cell array 100 comprising a plurality of bit cells BC1, . . . , BCn having a static random access memory architecture. The memory cell array 100 further comprises a plurality of wordlines WL_0, . . . , WL_TOP and a bitlines BL1, . . . , BLn being arranged in rows R0, . . . , RTOP and columns, C1, . . . , Cn in the cell array and being operatively connected to the plurality of bit cells BC1, . . . , BCn. The integrated circuit 10 further comprises the column address decoder 200 to generate the column address signal CA, a row address decoder—not shown in FIG. 5—to generate the row address signal RA and the write driver 300 having the same functionality and arrangement as explained with reference to FIG. 1.

For reasons of simplified illustration, FIG. 5 just shows the memory cell array 100 comprising the first column with a complementary-pair bitlines from which only one bitline is referenced by BL1, and the second column C2 with complementary-pair bitlines from which only one bitline is referenced by BL2. Bit cells BC1 and BC2 are coupled to the common wordline WL_TOP. The bit cell BC1 is coupled to the bitline BL1 of column C1, and the bit cell BC2 is coupled to the bitline BL2 of column C2. The column address decoder 200 is configured to select one of bitlines BL1, BL2 for transferring a data value D0 to be written in one of the bit cells BC1, BC2 coupled to the selected one of the bitlines BL1, BL2 and the wordline WL_TOP. The write driver 300 is configured to provide the data value D to the selected bitline BL1, BL2 to write the data value D in said one of the bit cells BC1, BC2 coupled to the selected bitline during a write access to the selected bit cell. The bitlines write driver 300 is coupled to the bitlines BL1 and BL2 so that column multiplexing allows sharing the common write driver 300 for the set of columns C1 and C2.

The integrated circuit 10 is configured to be operated in a write operation mode to generate a wordline voltage WLV on the wordline WL_TOP to write the data value D in the bit cell BC1, when bit cell BC1 is selected for a write access. The column address decoder 200 is configured to select the bitline BL1 for the write access to the bit cell BC1 in the write operation mode. The write driver 300 is configured to provide the data value D to the bitline BL1 in the write operation mode. The integrated circuit 10 is configured to generate the wordline voltage WLV with a voltage level in dependence on a course of the voltage level of the bitline BL2 coupled to the non-selected bit cell BC2 during a write access to the selected bit cell BC1 in the write operation mode.

The integrated circuit 10 is configured to perform the two-phase write scheme illustrated in FIG. 3. In particular, the integrated circuit 10 is configured to be operated in a first phase P1 and in a subsequent second phase P2 of the write operation mode. The integrated circuit 10 is configured to be operated in the phase P1 of the write operation mode such that the wordline voltage WLV of the selected wordline WL_TOP is increased at the beginning of the phase P1 of the write operation mode from a low voltage level L1, for example 0 V, to a voltage level L2 which is kept constant until the end of the phase P1 of the write operation mode. The integrated circuit 10 is further configured to be operated in the phase P2 of the write operation mode following phase P1 such that the wordline voltage WLV of the selected wordline WL_TOP is increased at the beginning of the phase P2 of the write operation mode from the voltage level L2 to a higher voltage level L3 which is kept constant until to the end of the phase P2 of the write operation mode.

According to an embodiment of the integrated circuit 10, the integrated circuit 10 is configured such that the voltage level BLV at the bitline BL2 coupled to the non-selected bit cell BC2 is decreased from the voltage level L3 to the voltage level L1, when the integrated circuit 10 is operated in the write operation mode. The scenario of the bitline voltage discharging of bitline BL2 occurs during a pseudo read for the half-selected bit cell BC2 during a write access to the selected bit cell BC1 in the column multiplexed architecture of the memory cell array 100.

According to an embodiment of the integrated circuit 10, the integrated circuit is configured such that the wordline voltage WLV at the selected wordline WL_TOP is increased from the level L2 to the level L3 when the voltage at the half-selected bit cell BC2 drops below a threshold level T.

The voltage level L1 may be 0 V. The voltage level L2 may be in a range between 0.8×VDD to 0.9×VDD, and is preferably 0.85×VDD, wherein voltage level VDD is the voltage level of the supply voltage of the integrated circuit. The voltage level L3 may be the level of the supply voltage VDD of the integrated circuit. The threshold level T may be in a range between 0.2×VDD and 0.4×VDD and is preferably 0.3×VDD.

In order to perform the two-phase write scheme, the integrated circuit 10 comprises a read assist circuitry 400, a reference bitline discharge timer 600, a control circuitry 700 and a delay circuitry 800.

A respective read assist circuitry 400 is coupled to each of the wordlines. The read assist circuitry 400 coupled to the wordline WL_TOP may comprise a controllable resistor 401 having a resistance being controllable by a control signal S being applied to the read assist circuitry 400. The controllable read assist circuitry 400 is configured to be operated in an activated state in the phase P1 of the write operation mode, in which the resistance of the controllable resistor 401 is controlled such that the wordline voltage WLV of the wordline WL_TOP is increased from the voltage level L1 to the voltage level L2 and is kept constant at the voltage level L2. The controllable read assist circuitry 400 is further configured to be operated in a deactivated state in the phase P2 of the write operation mode, in which the resistance of the controllable resistor 401 is controlled such that the wordline voltage WLV is increased from the voltage level L2 to the voltage level L3.

A wordline driver circuitry 500 is coupled to the wordline WL_TOP to apply the wordline voltage WLV to the wordline WL_TOP to control a write/read access to the bit cells BC1, BC2. The wordline driver circuitry 500 may comprise a switch 501, for example a PMOS switch, and a switch 502, for example a NMOS switch, coupled between a power rail to supply the supply power voltage VDD and a reference potential, for example a ground potential. The read assist circuitry 400 and the wordline driver circuitry 500 are configured as a resistive network to control the voltage level of the wordline voltage WLV of the wordline WL_TOP during the write access to the bit cell BC1 in the write operation mode of the integrated circuit.

The reference bitline discharge timer 600 may comprise a reference bitline RBL having a reference bitline voltage level RBLV being synchronized with the voltage level BLV at the bitline BL2 coupled to the half-selected bit cell BC2, during a write access to the bit cell BC1, i.e. the selected bit cell, in the write operation mode such that the voltage level RBLV of the reference bitline RBL decreases from the voltage level L3 to the voltage level L1 in phase P1 of the write operation mode within the same time as the voltage level BLV of the bitline BL2 coupled to the half-selected bit cell BC2 decreases from the voltage level L3 to the voltage level L1 in the phase P1 of the write operation mode. The reference bitline RBL may be coupled via a controllable switch 601 to a supply power rail to supply the supply voltage VDD to the reference bitline RBL. A plurality of bit cells BC may be connected to the reference bitline RBL. An inverter 602 is coupled to the end of the reference bitline RBL.

The control circuitry 700 is configured to generate the control signal S in dependence on the voltage level RBLV of the reference bitline RBL. The control circuitry 700 may be configured as a 2:1 multiplexer having a control terminal C700 to apply an output signal $\Phi\_D$ of the delay circuitry 800. The delay circuitry 800 has an input terminal 1800 to apply an input signal $\Phi$ being the output signal of the reference bitline discharge timer 600 which is generated at the output terminal of the inverter 602. The input signal $\Phi$ of the delay circuitry 800 is dependent from the voltage level RBLV of the reference bitline RBL. The delay circuitry 800 further comprises a control terminal C800 to apply a control signal DSEL and an output terminal O800 to generate the output signal $\Phi\_D$. The delay circuitry 800 is configured to generate the output signal $\Phi\_D$ with the voltage level of the input signal $\Phi$ with a delay time in relation to the voltage level of the input signal $\Phi$ of the delay circuitry 800, wherein the delay time is dependent on the control signal DSEL.

The operation of the integrated circuit 10 is further explained with reference to FIG. 6 which shows a timing diagram of a clock signal CLK applied to the wordline driver circuitry 500 and the reference bitline discharge timer 600, the voltage level WLV at the selected wordline WL_TOP, the voltage level RBLV at the reference bitline RBL and the course of the output signal $\Phi\_D$ of the delay circuitry 800.

To access a selected row, for example row RTOP, through the wordline WL_TOP, the clock signal CLK is gated by row address decoded signals to switch on the wordline driver PMOS switch 501 of the wordline driver circuitry 500. In order to select bit cell BC1 for a write access the column address decoder 200 generates the column address signal CA to select bitline BL1 of column C1 for a write operation to the bit cell BC1. The clock signal CLK is logic "0" and the voltage level WLV of the selected wordline WL_TOP is L1 before the integrated circuit 10 is operated in the write operation mode.

When the signal CLK is logic "0", the reference bitline RBL is precharged to the voltage level L3, for example the voltage level VDD of the power supply rail. The precharged voltage level L3 of the reference bitline RBL forces the reference bitline discharge timer output signal $\Phi$ to logic "0". Also, the output signal $\Phi\_D$ of the delay circuitry 800 is logic "0" which is a delayed version of the input signal $\Phi$, wherein the delay is controlled by the control signal DSEL. The logic "0" of the output signal $\Phi\_D$ is applied to control terminal C700 of control circuitry 700 and selects input signal RAS="1" to be relayed onto the output of the control circuitry 700 which is configured as a 2:1 multiplexer in inverted mode to control the read assist circuitry 400. The signal RAS="1" activates the read assist circuitry 400 coupled to wordline WL_TOP so that PMOS switch 401 of the read assist circuitry 400 is switched in a conductive state to drive wordline WL_TOP to ground level. With CLK="0", the wordlines are already driven to ground level through the NMOS switch 502 of the wordline driver circuitry 500.

Figure 6:
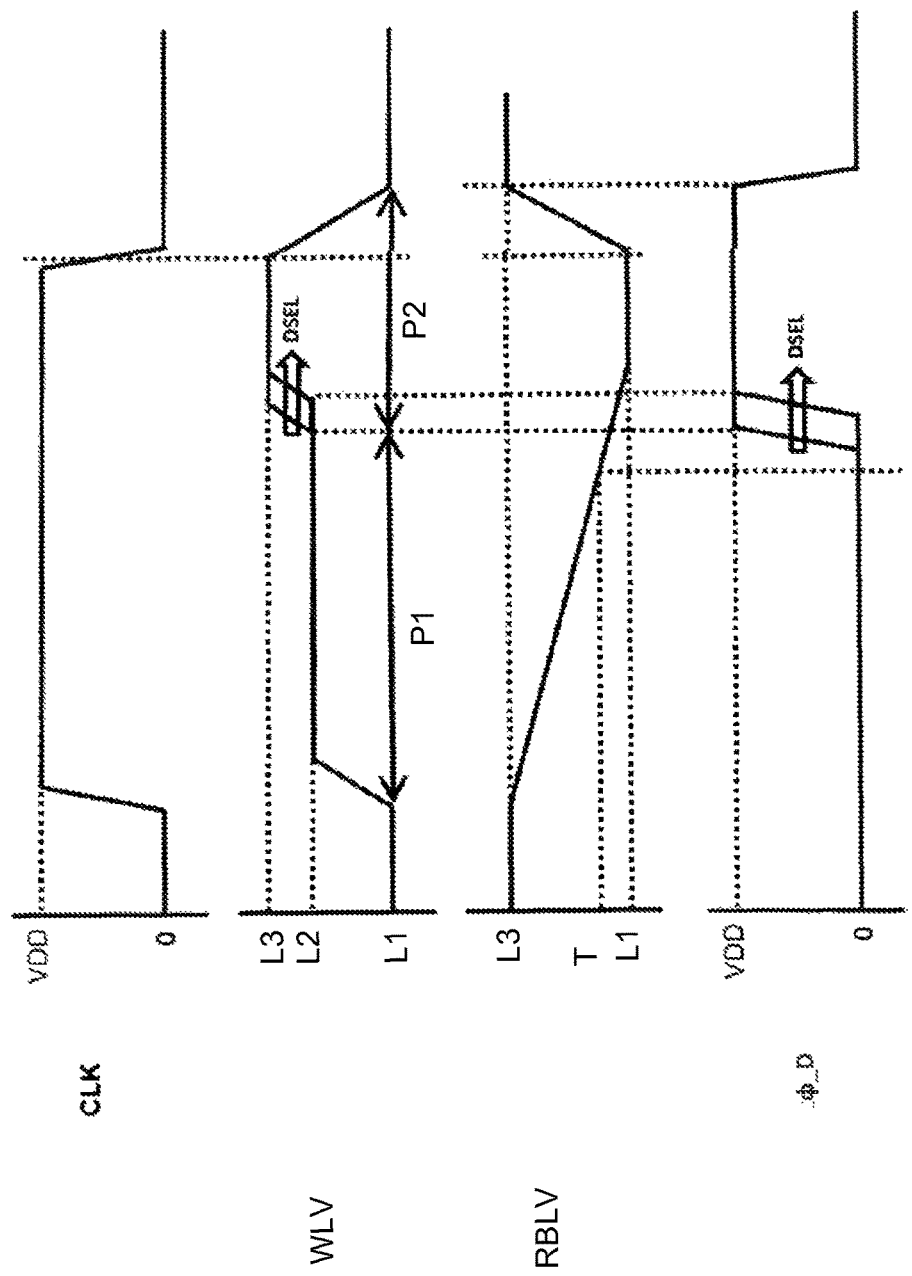
FIG. 6 shows a timing diagram illustrating the two-phase write scheme.

FIG. 6 depicts the timing sequences of the two-phase write scheme in a column multiplexed SRAM design as shown in FIG. 5. When the clock signal CLK is asserted to logic "1", phase 1 of the write operation mode begins, wherein the read assist circuitry 500 is still operated in the activated mode. The clock signal CLK="1" activates the selected wordline WL_TOP through the wordline driver circuitry 500, particularly by means of PMOS switch 501, reaching a voltage level WLV of L2, for example 85% of the supply voltage VDD of the power rail decided by the ratio of resistance of the PMOS switch 501 of the wordline driver circuitry 500 and PMOS switch 401 of the read assist circuitry 400 to improve half-selected bit cells hold stability.

During phase P1 of the write operation mode wherein the wordline voltage level WLV is preferably 85% of the supply voltage level VDD, the reference bitline RBL starts discharging to replicate the discharging of bitline BL2 of the unselected column C2. The reference bitline discharge timer 600 is configured such that the discharging behavior of the reference bitline RBL is approximately same to the bitlines discharge rate of the bitline 2 of the unselected column C2 wherein half-selected bit cell BC2 undergoes pseudo read operation. In this process unselected column bitlines get synchronized with the data of the half-selected bit cell data. The time, at which the reference bitline RBL reaches the threshold level T, for example a voltage of VDD/3, the output signal of the reference bitline discharge timer is asserted to logic "1".

The delay circuitry 800 is employed to take care of any process variation causing early switching of the input signal Φ to logic "1" by introducing a time delay controlled through the control signal DSEL. Next, at the beginning of phase P2 of the write operation mode, the output signal Φ_D is also asserted to logic "1" after the delay time set forth by delay circuitry 800 through the control signal DSEL. The signal value of logic "1" of the output signal Φ_D selects logic "0" to be relayed to the control circuitry 700 output in inverted mode to deactivate the read assist circuitry 400 by switching the controllable switch 401 in a non-conductive state.

The read assist circuitry 400 is operated in the deactivated state during the phase P2 of the write operation. The time instant, when the output Φ_D switches from logic "0" to logic "1" (VDD), is the end of phase P1 of the write operation mode. Phase P1 of the write operation mode enables to improve the static noise margin of the half-selected bit cell BC2. Now, with deactivated read assist circuitry 400, the voltage level WLV of the selected wordline WL_TOP reaches the supply voltage VDD without compromising the cell hold stability of the half-selected bit cell BC2. With this, phase P2 of the write operation mode begins, wherein the write margin is improved by virtue of power rail wordline voltage level VDD.

The disclosed configuration also includes a computer readable storage medium, e.g., a flash memory or disk storage, that includes a circuit description corresponding to a physical integrated circuit as described with FIGS. 1 and 5. The circuit description is used by an electronic design automation tool system to provide for a layout of a circuit design in a chip fabrication process. Such configuration beneficially reduces the circuit implementation trial and error in a circuit design process thereby saving memory and processor resources and improving circuit design development time and throughput.

What is claimed is:

1. A read and write port SRAM memory device, comprising:
    a memory cell array comprising a plurality of bit cells comprising a first and a second one of the bit cells having a static random access memory architecture;
    a plurality of wordlines and bitlines being arranged in rows and columns in the memory cell array and being operatively connected to the plurality of bit cells such that the first and the second bit cell are coupled to one of the wordlines and the first bit cell is coupled to a first one of the bitlines and the second bit cell is coupled to a second one of the bitlines, wherein the first and the second bitline are arranged in different columns of the memory cell array;
    a column address decoder to select one of the first and second bitline for transferring a data value to be written in one of the first and second bit cell coupled to the selected one of the first and second bitline and said one of the wordlines; and
    a write driver to provide the data value to the selected one of the first and second bitline to write the data value in said one of the first and second bit cell during a write access to said one of the first and the second bit cell, said write driver being coupled to the first and the second bitline,
    wherein the SRAM memory device is configured to be operated in a write operation mode to generate a wordline voltage on said one of the wordline to write the data value in the first bit cell,
    wherein the column address decoder is configured to select the first bitline for the write access to the first bit cell in the write operation mode,
    wherein the write driver is configured to provide the data value to the first bitline in the write operation mode,
    wherein the SRAM memory device is configured to generate the wordline voltage with a voltage level in dependence on a course of the voltage level of the second bitline during the write access to the first bit cell in the write operation mode,
    wherein the SRAM memory device is configured to be operated in a first phase and a subsequent second phase of the write operation mode,
    wherein the SRAM memory device is configured to be operated in the first phase of the write operation mode such that the wordline voltage is increased at the beginning of the first phase of the write operation mode from a first voltage level to a second voltage level which is kept constant until to the end of the first phase of the write operation mode,
    wherein the SRAM memory device is configured to be operated in the second phase of the write operation mode such that the wordline voltage is increased at the beginning of the second phase of the write operation mode from the second voltage level to a third voltage level which is kept constant until to the end of the second phase of the write operation mode, and
    wherein the SRAM memory device is configured such that the voltage level at the second bitline is decreased from the third voltage level to the first voltage level, when the SRAM memory device is operated in the write operation mode.

2. The SRAM memory device of claim 1,
    wherein the SRAM memory device is configured such that the wordline voltage at the wordline is increased from the second level to the third level, when the voltage at the second bitline drops below a threshold level.

3. The SRAM memory device of claim 1, comprising:
    a read assist circuitry coupled to said one of the wordline, wherein the read assist circuitry comprises a controllable resistor having a resistance being controllable by a control signal being applied to the read assist circuitry,
    wherein the controllable read assist circuitry is configured to be operated in an activated state in the first phase of the write operation mode, in which the resistance of the controllable resistor is controlled such that the wordline voltage is increased from the first voltage level to the second voltage level, and
    wherein the controllable read assist circuitry is configured to be operated in a deactivated state in the second phase of the write operation mode, in which the resistance of the controllable resistor is controlled such that the wordline voltage is increased from the second voltage level to a third voltage level.

4. The SRAM memory device of claim 3, comprising:
    a wordline driver circuitry coupled to said one of the wordlines to apply the wordline voltage to said one of the wordlines to control an access to the first and second bit cell,
    wherein the read assist circuitry and the wordline driver circuitry are configured as a resistive network to control the voltage level of the wordline voltage of said wordline during the write access to the first bit cell in the write operation mode of the SRAM memory device.

5. The SRAM memory device of claim 1, further comprising:
a reference bitline having a voltage level being synchronized with the voltage level of the second bitline during a write access to the first bit cell in the write operation mode such that the voltage level of the reference bitline decreases from the third voltage level to the first voltage level in the first phase of the write operation mode within the same time as the voltage level of the second bitline decreases from the third voltage level to the first voltage level in the first phase of the write operation mode.

6. The SRAM memory device of claim 5, further comprising:
a control circuitry to generate the control signal in dependence on the voltage level of the reference bitline.

7. The SRAM memory device of claim 6, further comprising:
a delay circuitry having an input terminal to apply an input signal (1) being dependent from the voltage level (RBLV) of the reference bitline, a control terminal to apply a second control signal and an output terminal to generate an output signal (Φ_D),
wherein the delay circuitry is configured to generate the output signal (Φ_D) with the voltage level of the input signal (Φ) with a delay time in relation to the voltage level of the input signal (Φ), wherein the delay time is dependent on the control signal, and
wherein the control circuitry has a control terminal to apply the output signal (Φ_D) of the delay circuitry.

8. The SRAM memory device of claim 1,
wherein the first voltage level is 0 V, the second voltage level is in a range of between 80% and 90% of the level of the supply voltage of the SRAM memory device, and the third voltage level is the level of the supply voltage of the SRAM memory device, and
wherein the threshold level is between 20% and 40% of the level of the supply voltage of the SRAM memory device.

9. A method using a two phase write scheme to improve low voltage write ability in read and write port SRAM memories, comprising:
providing a memory cell array comprising a plurality of bit cells comprising a first and a second one of the bit cells having a static-random-access memory architecture, a plurality of wordlines and bitlines being arranged in rows and columns in the memory cell array and being operatively connected to the plurality of bit cells such that the first and the second bit cell are coupled to one of the wordlines and the first bit cell is coupled to a first one of the bitlines and the second bit cell is coupled to a second one of the bitlines, wherein the first and the second bitline are arranged in different columns of the memory cell array, a column address decoder to select one of the first and second bitline for transferring a data value to be written in one of the first and second bit cell coupled to the selected one of the first and second bitline and said one of the wordlines, and a write driver to provide the data value to the selected one of the first and second bitline to write the data value in said one of the first and second bit cell during a write access to said one of the first and second bit cell, said write driver being coupled to the first and the second bitline;

operating the SRAM memory device in a write operation mode to generate a wordline voltage on said one of the wordline to write the data value in the first bit cell;
selecting the first bitline for the write access to the first bit cell in the write operation mode;
providing the data value to the first bitline in the write operation mode;
generating the wordline voltage with a voltage level in dependence on a course of the voltage level of the second bitline during the write access to the first bit cell in the write operation mode
operating the SRAM memory device in a first phase of the write operation mode such that the wordline voltage is increased at the beginning of the first phase of the write operation mode from a first voltage level to a second voltage level which is kept constant until to the end of the first phase of the write operation mode;
operating the SRAM memory device in a second phase of the write operation mode such that the wordline voltage is increased at the beginning of the second phase of the write operation mode from the second voltage level to a third voltage level which is kept constant until to the end of the second phase of the write operation mode;
decreasing the voltage level at the second bitline from the third voltage level to the first voltage level, when the SRAM memory device is operated in the write operation mode; and
increasing the wordline voltage at the wordline from the second voltage level to the third voltage level, when the voltage at the second bitline drops below a threshold level.

10. A non-transitory computer readable storage medium storing a description representing a read and write port SRAM memory device for use in an electronic design automation tool, the SRAM memory device comprising:
a memory cell array comprising a plurality of bit cells comprising a first and a second one of the bit cells having a static random access memory architecture;
a plurality of wordlines and bitlines being arranged in rows and columns in the memory cell array and being operatively connected to the plurality of bit cells such that the first and the second bit cell are coupled to one of the wordlines and the first bit cell is coupled to a first one of the bitlines and the second bit cell is coupled to a second one of the bitlines, wherein the first and the second bitline are arranged in different columns of the memory cell array;
a column address decoder to select one of the first and second bitline for transferring a data value to be written in one of the first and second bit cell coupled to the selected one of the first and second bitline and said one of the wordlines; and
a write driver to provide the data value to the selected one of the first and second bitline to write the data value in said one of the first and second bit cell during a write access to said one of the first and the second bit cell, said write driver being coupled to the first and the second bitline,
wherein the SRAM memory device is configured to be operated in a write operation mode to generate a wordline voltage on said one of the wordline to write the data value in the first bit cell,
wherein the column address decoder is configured to select the first bitline for the write access to the first bit cell in the write operation mode,
wherein the write driver is configured to provide the data value to the first bitline in the write operation mode, wherein the SRAM memory device is configured to generate the wordline voltage with a voltage level in dependence on a course of the voltage level of the second bitline during the write access to the first bit cell in the write operation mode, wherein the SRAM memory device is configured to be operated in a first phase and a subsequent second phase of the write operation mode, wherein the SRAM memory device is configured to be operated in the first phase of the write operation mode such that the wordline voltage is increased at the beginning of the first phase of the write operation mode from a first voltage level to a second voltage level which is kept constant until to the end of the first phase of the write operation mode, wherein the SRAM memory device is configured to be operated in the second phase of the write operation mode such that the wordline voltage is increased at the beginning of the second phase of the write operation mode from the second voltage level to a third voltage level which is kept constant until to the end of the second phase of the write operation mode, and wherein the SRAM memory device is configured to decrease the voltage level at the second bitline from the third voltage level to the first voltage level, when the SRAM memory device is operated in the write operation mode.

11. The computer readable storage medium of claim 10, wherein the description representing the SRAM memory device comprises a further description of the SRAM memory device for use in the electronic design automation tool of a read assist circuitry coupled to said one of the wordline, wherein the read assist circuitry comprises a controllable resistor having a resistance being controllable by a control signal being applied to the read assist circuitry, wherein the controllable read assist circuitry is configured to be operated in an activated state in the first phase of the write operation mode, in which the resistance of the controllable resistor is controlled such that the wordline voltage is increased from the first voltage level to the second voltage level, and wherein the controllable read assist circuitry is configured to be operated in a deactivated state in the second phase of the write operation mode, in which the resistance of the controllable resistor is controlled such that the wordline voltage is increased from the second voltage level to the third voltage level.

12. A non-transitory computer readable storage medium storing program code executable by at least one processor, the program code when executed causes the at least one processor to:

provide a memory cell array comprising a plurality of bit cells comprising a first and a second one of the bit cells having a static-random-access memory architecture, a plurality of wordlines and bitlines being arranged in rows and columns in the memory cell array and being connected to the plurality of bit cells such that the first and the second bit cell are coupled to one of the wordlines and the first bit cell is coupled to a first one of the bitlines and the second bit cell is coupled to a second one of the bitlines, wherein the first and the second bitline are arranged in different columns of the memory cell array, a column address decoder to select one of the first and second bitline, and a write driver to provide a data value to the selected one of the first and second bitline to write the data value in said one of the first and second bit cell during a write access to said one of the first and the second bit cell, said write driver being coupled to the first and the second bitline;

operate the SRAM memory device in a write operation mode to generate a wordline voltage on said one of the wordline to write the data value in the first bit cell;

select the first bitline for the write access to the first bit cell in the write operation mode;

provide the data value to the first bitline in the write operation mode;

generate the wordline voltage with a voltage level in dependence on a course of the voltage level of the second bitline during the write access to the first bit cell in the write operation mode, operate the SRAM memory device in a first phase of the write operation mode such that the wordline voltage is increased at the beginning of the first phase of the write operation mode from a first voltage level to a second voltage level which is kept constant until to the end of the first phase of the write operation mode;

operate the SRAM memory device in a second phase of the write operation mode such that the wordline voltage is increased at the beginning of the second phase of the write operation mode from the second voltage level to a third voltage level which is kept constant until to the end of the second phase of the write operation mode;

decrease the voltage level at the second bitline from the third voltage level to the first voltage level, when the SRAM memory device is operated in the write operation mode; and increase the wordline voltage at the wordline from the second voltage level to the third voltage level, when the voltage at the second bitline drops below a threshold level.

* * * * *

UNITED STATES PATENT AND TRADEMARK OFFICE
CERTIFICATE OF CORRECTION

PATENT NO.          : 9,842,642 B2                           Page 1 of 1
APPLICATION NO.     : 14/828364
DATED               : December 12, 2017
INVENTOR(S)         : M. Sultan M. Siddiqui et al.

It is certified that error appears in the above-identified patent and that said Letters Patent is hereby corrected as shown below:

Column 10, Claim 3, Line 59: replace "a third voltage level" with -- the third voltage level --.
    Column 11, Claim 5, Line 7: replace "a write access" with -- the write access --.
    Column 11, Claim 7, Line 23: replace "input signal (1)" with -- input signal ($\varphi$) --.
    Column 12, Claim 9, Line 11: replace "write operation mode" with -- write operation mode; --.
    Column 14, Claim 12, Line 29: replace "write operation mode," with -- write operation mode; --.

Signed and Sealed this
Fourth Day of September, 2018

Andrei Iancu
*Director of the United States Patent and Trademark Office*